(12) United States Patent
Luo et al.

(10) Patent No.: US 7,483,329 B2
(45) Date of Patent: Jan. 27, 2009

(54) FLASH CARD AND CONTROLLER WITH INTEGRATED VOLTAGE CONVERTER FOR ATTACHMENT TO A BUS THAT CAN OPERATE AT EITHER OF TWO POWER-SUPPLY VOLTAGES

(75) Inventors: Jianjun Luo, Sunnyvale, CA (US); Chris Tsu, Saratoga, CA (US); Charles C. Lee, Cupertino, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 229 days.

(21) Appl. No.: 11/625,309

(22) Filed: Jan. 20, 2007

(65) Prior Publication Data

US 2007/0147157 A1 Jun. 28, 2007

Related U.S. Application Data

(63) Continuation-in-part of application No. 11/466,759, filed on Aug. 23, 2006, and a continuation-in-part of application No. 09/478,720, filed on Jan. 6, 2000, now Pat. No. 7,257,714.

(51) Int. Cl.
*G11C 5/14* (2006.01)

(52) U.S. Cl. ...................................... 365/226; 365/227
(58) Field of Classification Search ................. 365/226, 365/227, 189.09
See application file for complete search history.

(56) References Cited

U.S. PATENT DOCUMENTS 7,069,369 B2 * 6/2006 Chou et al. ................. 710/301

* cited by examiner

*Primary Examiner*—Vu A Le
(74) *Attorney, Agent, or Firm*—Stuart T. Auvinen; gPatent LLC (57) ABSTRACT

A dual-voltage secure digital (SD) card can be inserted into a legacy host or a newer host. Legacy hosts drive a high voltage such as 3.3 volts onto the power line of the SD bus, while newer hosts drive the power line with a reduced voltage such as 1.8 volts. A flash and voltage controller chip on the SD card has a controller core that operates at the reduced voltage. A voltage regulator on the SD card, or a power management unit inside the controller chip generates an internal power voltage of 1.8 volts from the dual-voltage SD bus power line. The internal power voltage is applied to the controller core and to a voltage converter that generates a flash power voltage from the internal power voltage. The flash power voltage is applied to flash-memory chips on the SD card that operate at the higher voltage.

20 Claims, 6 Drawing Sheets

FLASH CARD AND CONTROLLER WITH INTEGRATED VOLTAGE CONVERTER FOR ATTACHMENT TO A BUS THAT CAN OPERATE AT EITHER OF TWO POWER-SUPPLY VOLTAGES

RELATED APPLICATIONS

This application claims the benefit under 35 USC § 119(a) of China patent application No. 200620100541.2 filed Jan. 20, 2006, and China patent application No. 200620100542.7 filed Jan. 20, 2006.

This application is a continuation-in-part (CIP) of the co-pending application U.S. Ser. No. 09/478,720, filed Jan. 6, 2000. This application is also a CIP of U.S. Ser. No. 11/466,759, filed Aug. 23, 2006, which is a CIP of U.S. patent application Ser. No. 10/789,333, filed on Feb. 26, 2004, now abandoned. This application is also related to application Ser. No. 09/366,976, filed on Aug. 4, 1999, now U.S. Pat. No. 6,547,130, all of which are incorporated herein as though set forth in full.

FIELD OF THE INVENTION

This invention relates to flash memory storage cards, and more particularly to a dual-voltage Secure Digital (SD) controller integrated with a voltage converter.

BACKGROUND OF THE INVENTION

Flash memory cards have gained wide acceptance for its non-volatile flash-memory storage, which is ideal for portable devices that may lose power, since the data is not lost when stored in the flash memory. Flash memories are constructed from electrically-erasable programmable read-only memory (EEPROM) cells. Since flash memory is solid-state, moving parts are not present. Flash does not fail under moderate shock or vibration that would cause a failure in a rotating disk.

Rather than use a randomly-addressable scheme such as is common with dynamic-random-access memory (DRAM), many flash memories use a block-based addressing where a command and an address are sent over the data bus and then a block of data is read or written. Since the data bus is also used to send commands and addresses, fewer pins are needed on the flash-memory chip, reducing cost. Thus flash memory is often used as a mass-storage device rather than a randomly-addressable device.

A popular bus standard is Multi-Media Card (MMC). An extension of MMC is known as Secure Digital (SD). MMC and SD flash devices are common today.

As process technologies improve and devices are scaled down in size, the power-supply voltage needed to operate integrated circuits decreases. Some devices such as flash memory chips may operate at 3.3-volt power supplies, while other devices such as controller chips may operate using a 1.8-volt power supply.

More recently, bus standards have been extended to operate at lower voltages. For example, the SD bus may operate using a 3.3-volt power supply or the SD bus may operate at a reduced 1.8-volt power supply. Larger buses may include several power-supply pins for the different power-supply voltages. However, since the SD bus has a limited number of pins, the SD bus has only one power supply pin, which carries either 1.8 or 3.3 volts, but not both. Thus SD devices receive only one power-supply voltage.

An older SD card that needs 3.3 volts to operate may be plugged into a newer host that drives 1.8 volts onto the power-supply pin. This older SD device cannot operate properly with the newer host. A newer SD card may require 1.8 volts and may not operate properly when inserted into an older host that supplies 3.3 volts. Thus voltage compatibility issues arise.

What is desired is a dual-voltage SD card. A dual-voltage SD card and controller that can receive either 3.3 or 1.8 volts from the power-supply pin of the SD bus is desirable. An SD controller chip using an advanced process that can operate at 1.8 volts is desired, even when the SD card is inserted into a 3.3-volt SD host.

DETAILED DESCRIPTION

The present invention relates to an improvement in dual-voltage memory cards. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
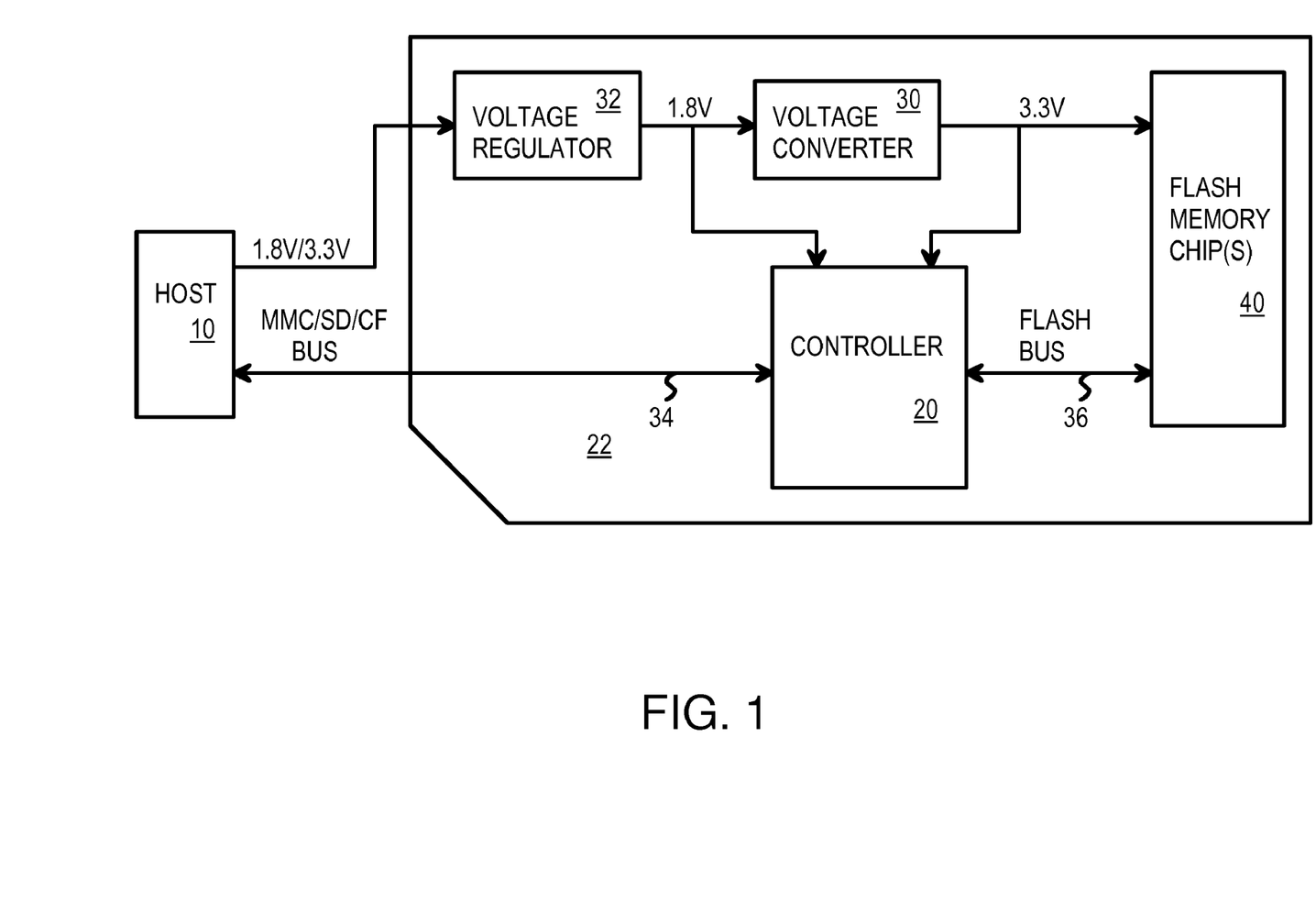
FIG. 1 is a block diagram of a dual-voltage SD card with a voltage regulator and a voltage converter.

FIG. 1 is a block diagram of a dual-voltage SD card with a voltage regulator and a voltage converter. Host 10 sends commands, addresses, and data over SD bus 34 to SD card 22, which is inserted into a SD/MMC slot in host 10. Host 10 can be an older host that drives 3.3 volts onto the power-supply line of SD bus 34, or can be a newer host that drives 1.8 volts onto the power-supply line of SD bus 34.

Controller 20 receives, decodes, and processes commands from host 10 that are received over SD bus 34. These commands include commands to read, erase, and write blocks of data in one or more of flash-memory chip 40. Flash bus 36 carries address, data, and commands that are generated or reformatted by a flash controller inside controller 20 to flash-memory chip 40.

An advanced process may be used to manufacture controller 20. This advanced process may provide high speed devices that require a low power-supply voltage such as 1.8 volts. Voltage regulator 32 receives the power-supply voltage from SD bus 34 and outputs a 1.8-volt internal supply to controller 20 and to voltage converter 30.

When the power-supply voltage on SD bus 34 is 3.3 volts, voltage regulator 32 steps down the voltage to 1.8 volts to apply to controller 20 and to voltage converter 30. When the power-supply voltage on SD bus 34 is 1.8 volts, voltage regulator 32 passes through the SD-bus voltage and applies it to controller 20 and to voltage converter 30. Thus 1.8 volts is output from voltage regulator 32 regardless of whether the input power voltage from host 10 is 1.8 or 3.3 volts, or other intermediate voltages.

The internal 1.8 supply voltage generated by voltage regulator 32 is input to voltage converter 30. Voltage converter 30 steps up the internal 1.8-volt voltage to generate a boosted voltage of 3.3 volts. The boosted voltage generated by voltage converter 30 is applied to the power-supply input of flash-memory chip 40. The boosted voltage from voltage regulator 32 is also applied to interface circuits in controller 20 that connect to flash bus 36, so that the high signals on flash bus 36 are close to the 3.3-volt boosted voltage. Thus high signals to flash-memory chip 40 on flash bus 36 are sufficiently high to be read by inputs of flash-memory chip 40.

Figure 2:
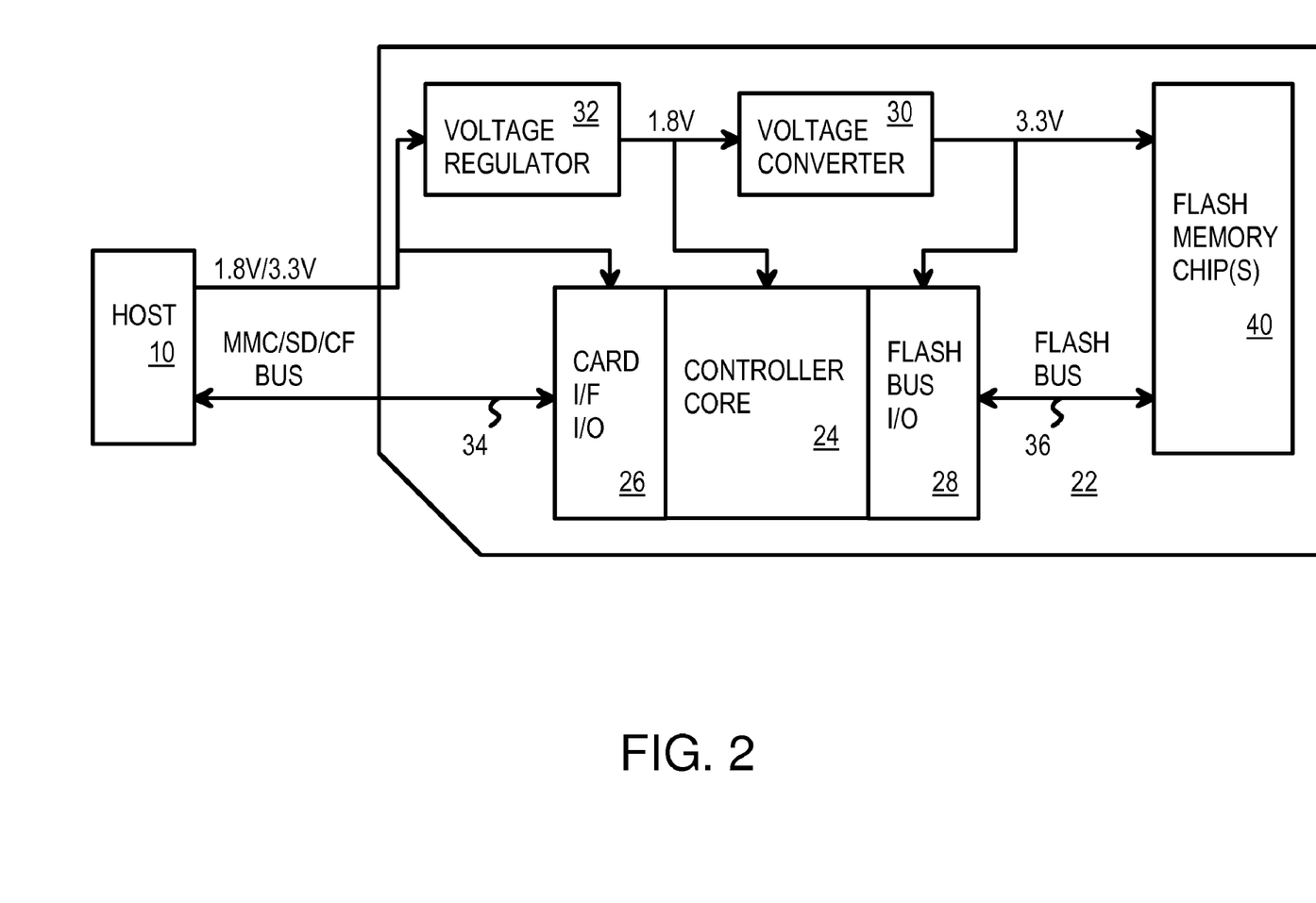
FIG. 2 shows interface voltages in more detail in a dual-voltage SD card with a voltage regulator and a voltage converter.

FIG. 2 shows interface voltages in more detail in a dual-voltage SD card with a voltage regulator and a voltage converter. Controller core 24 receives the internal 1.8 volt supply generated by voltage regulator 32 from the dual supply voltages on SD bus 34 from host 10. However, card interface I/O 26 receives the power-supply voltage on SD bus 34, which can be either 1.8 volt or 3.3 volt.

When host 10 drives a power voltage of 3.3 volts onto SD bus 34, card interface I/O 26 operates at 3.3 volts, driving high signals on SD bus 34 to around 3.3 volts, and interpreting inputs on SD bus 34 that are near 3.3 volts as high signals. When host 10 drives a reduced power voltage of 1.8 volts onto SD bus 34, card interface I/O 26 operates at 1.8 volts, driving high signals on SD bus 34 to around 1.8 volts, and interpreting inputs on SD bus 34 that are near 1.8 volts as high signals.

Voltage converter 30 receives the internal 1.8-volt supply generated by voltage converter 30 and generates the flash power voltage of 3.3 volts. The flash power voltage is applied to flash-memory chip 40 and to flash bus I/O 28. Flash bus I/O 28 converts 1.8-volt signals from controller core 24 to 3.3-volt signals for flash bus 36 that can be recognized as high input signals by flash-memory chip 40. Flash bus I/O 28 provides the proper voltage levels to interface to flash-memory chip 40.

Figure 3:
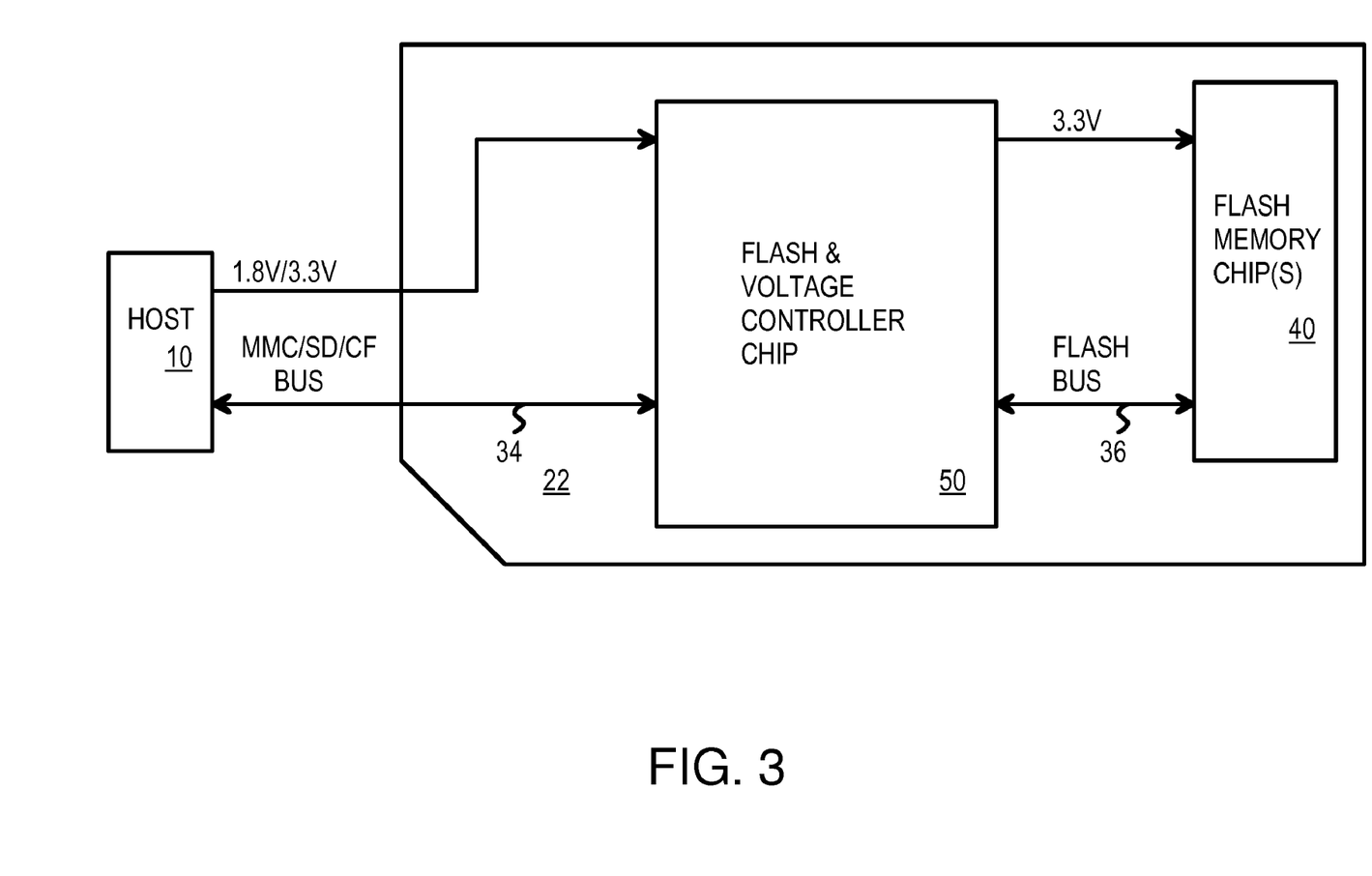
FIG. 3 shows a dual-voltage SD card with a controller chip that has an integrated voltage converter.

FIG. 3 shows a dual-voltage SD card with a controller chip that has an integrated voltage converter. SD card 22 stores data in flash-memory chip 40 which operates with a 3.3-volt power supply that is generated by a voltage converter inside flash and voltage controller chip 50. Flash and voltage controller chip 50 contains a flash controller that generates flash commands on flash bus 36 to flash-memory chip 40, and also contains an SD protocol controller that receives commands from host 10 over SD bus 34. Flash and voltage controller chip 50 also contains voltage interface circuits for buses 34, 36.

Flash and voltage controller chip 50 receives the power voltage on SD bus 34 that is either 1.8 volts or 3.3 volts. Flash and voltage controller chip 50 converts this SD-bus voltage to an internal 1.8 volts to power the controller core, and also converts the internal voltage to the flash power voltage of 3.3 volts, which is applied to flash-memory chip 40.

Figure 4:
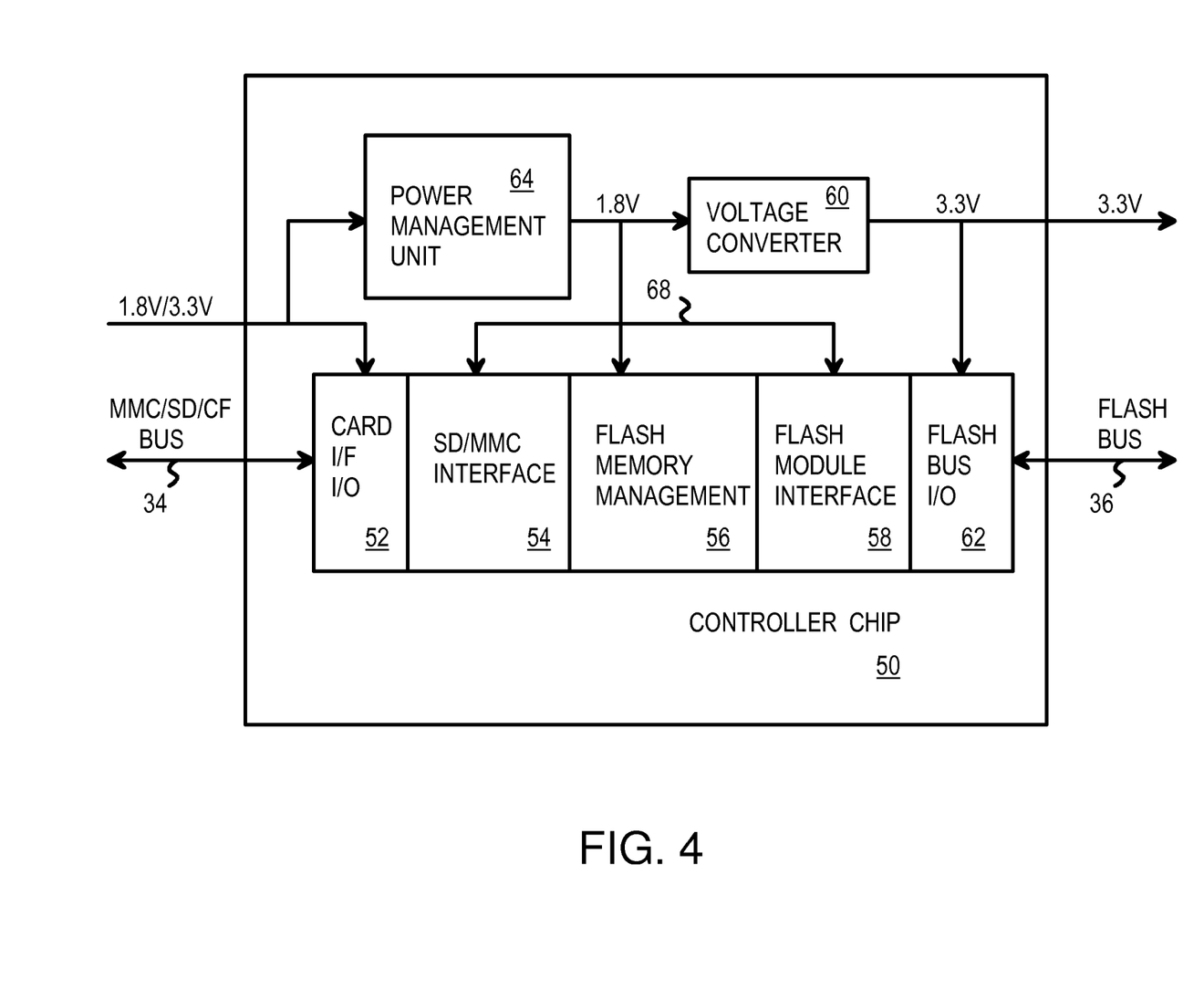
FIG. 4 shows the flash and voltage controller chip in more detail.

FIG. 4 shows the flash and voltage controller chip in more detail. Interior blocks such as SD protocol interface 54, flash memory manager 56, and flash module interface 58 operate at a lower 1.8-volt internal supply on internal power line 68 that is generated by power management unit 64. SD protocol interface 54 receives and interprets commands address and data in bus transactions from the host that are received by card interface I/O 52 from SD bus 34. Flash memory manager 56 performs memory management functions such as address translation to perform wear-leveling and bad-block avoidance of physical blocks in flash-memory chip 40 (FIG. 3). Flash module interface 58 generates the low-level commands to erase, write, and read blocks of data in flash-memory chip 40 that are sent over flash bus 36 by flash bus I/O 62.

Flash and voltage controller chip 50 routes the dual power voltage from the host on SD bus 34 to power management unit 64 and to card interface I/O 52. Card interface I/O 52 can thus operate at the same voltage as SD bus 34. When the host drives the power line in SD bus 34 to 1.8 volts, card interface I/O 52 operates at 1.8 volts. When the host drives the power line in SD bus 34 to 3.3 volts, card interface I/O 52 operates at 3.3 volts. Signal levels are converted by card interface I/O 52 to and from the lower 1.8-volt levels used in SD protocol interface 54.

The power-supply voltage on SD bus 34, either 1.8 or 3.3 volts, is applied power management unit 64. Power management unit 64 generates 1.8 volts on internal power line 68, either by passing through the SD-bus power voltage when the host generates a 1.8-volt power supply, or by reducing the power voltage from 3.3 volts to 1.8 volts when the host generates the higher 3.3-volt power on SD bus 34.

The internal 1.8 volts generated by power management unit 64 on internal power line 68 is applied as an input to voltage converter 60. A charge pump or other circuitry in voltage converter 60 raises the voltage to the flash power voltage of 3.3 volts. This flash voltage is output from flash and voltage controller chip 50 to flash-memory chip 40, and is also applied to flash bus I/O 62. Flash bus I/O 62 converts the 1.8 volt signals from flash module interface 58 to and from the 3.3-volt signals on flash bus 36 that can be used by flash-memory chip 40.

Figure 5:
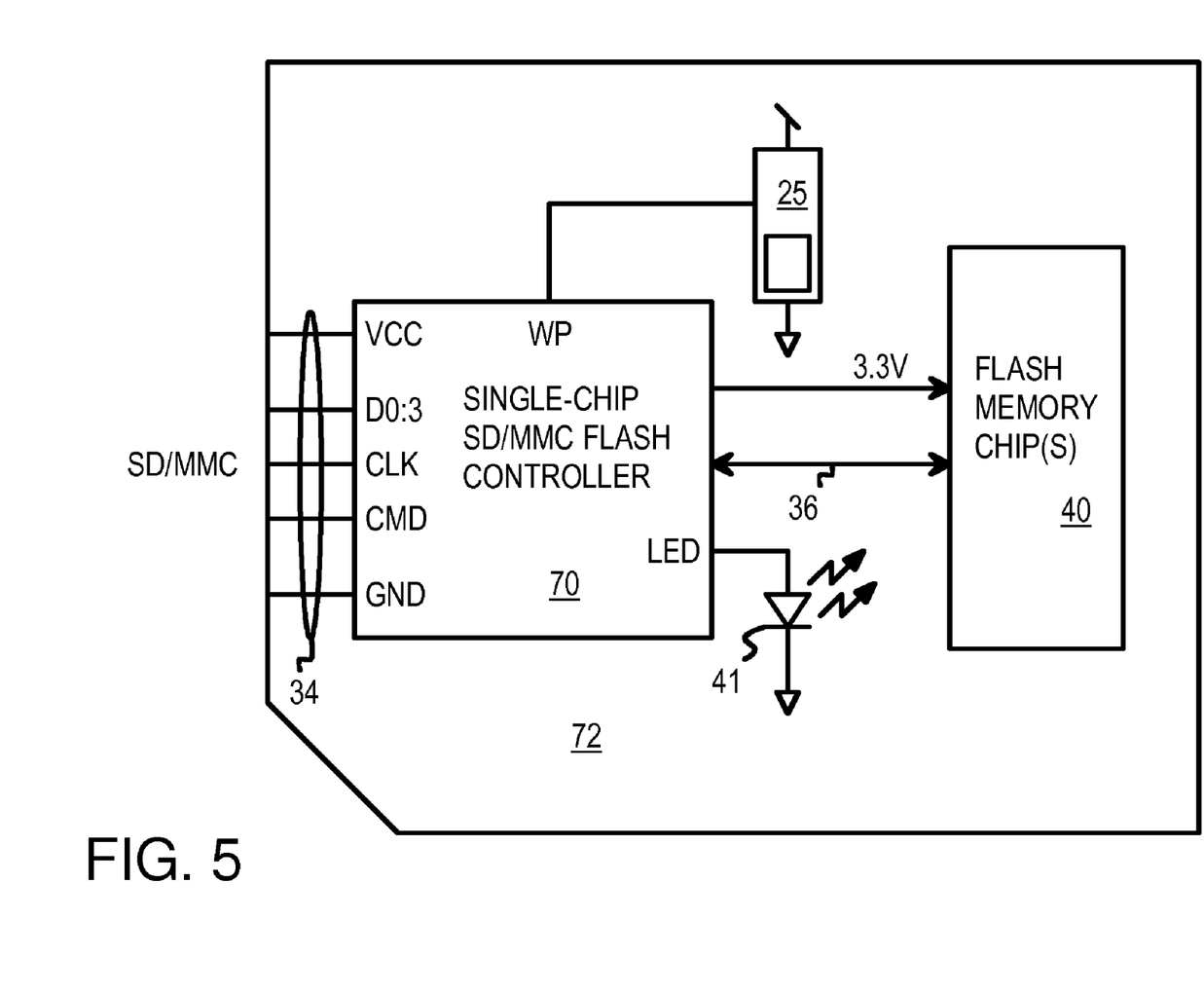
FIG. 5 shows external pin connections to a SD/MMC single-chip flash device.

FIG. 5 shows external pin connections to a SD/MMC single-chip flash device. SD single-chip flash device 70 on SD card 72 connects to the host through SD bus 34, which has power (Vcc), ground, a clock that is input to SD single-chip flash device 70, and a parallel data bus. The data bus may be 4 or 8 bits for various versions of the MMC and SD standards. A command pin CMD may also be present for the SD standard or may be multiplexed with a SD data pin. The data pins are full-swing non-differential and carry parallel data synchronized to the clock.

A write-protect (WP) pin connects externally to switch 25. Switch 25 can be switched by the user to indicate write-protect or write-enable modes of the flash memory inside SD single-chip flash device 70.

A status output pin for a light-emitting diode (LED) can be included on some embodiments. The status-LED pin can drive LED 41 to indicate a status of SD single-chip flash device 70. For example, LED 41 can be made to blink when flash memory 40 is being written so that the user does not unplug the device before writing is completed.

Relatively few pins are needed for SD single-chip flash device 70. Since SD bus 18 is 10 pins or less, depending on the SD version, excluding power and ground, as few as 10 signal pins are needed when no LED signaling is required. All commands, addresses, status, and data are carried as parallel clocked-data over the data lines in SD bus 34. Additional power and ground pins, or pins for other functions could be added, but packages with 10 signal pins are relatively inexpensive and require little board space. The total pin count on the package may be 20 or fewer pins. Power consumption is also reduced, since fewer higher-capacitance external signals are driven by SD single-chip flash device 70.

Flash memory chip 40 may require a higher power-supply voltage of 3.3 volts to operate. SD single-chip flash device 70 contains a voltage converter to generate the 3.3-volt power supply from the 1.8 or 3.3-volt power line on SD bus 34. Flash bus 36 also operates with high voltages of about 3.3 volts.

Figure 6:
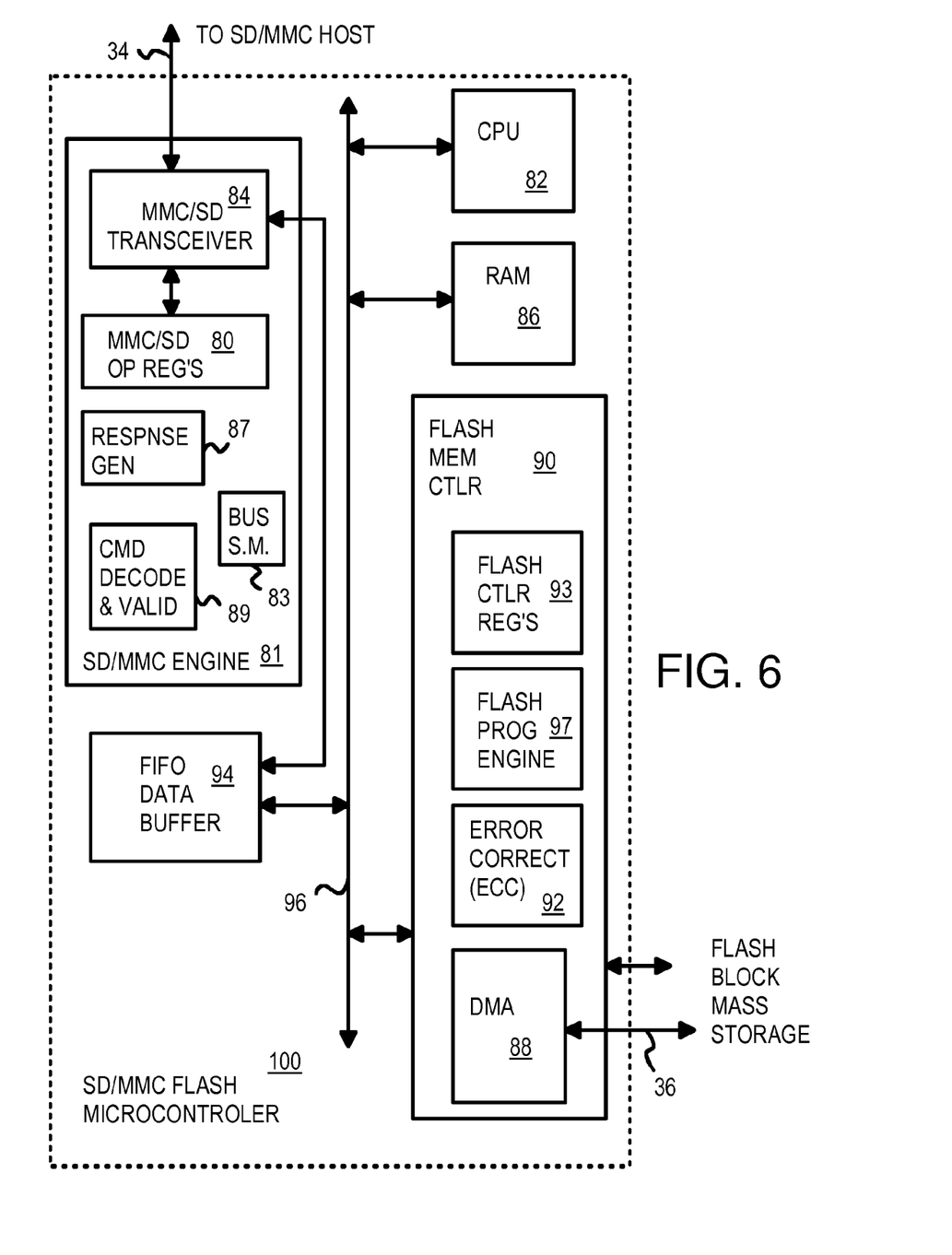
FIG. 6 is a block diagram of the SD flash microcontroller inside the SD single-chip flash device.

FIG. 6 is a block diagram of the SD flash microcontroller inside the SD single-chip flash device. Internal bus 96 connects CPU 82 with RAM 86, FIFO data buffer 94, direct-memory access (DMA) engine 88, and flash-memory controller 90. CPU 82 executes instructions from RAM 86, while DMA engine 88 can be programmed to transfer data between FIFO data buffer 94 and flash-memory controller 90. CPU 82 can operate on or modify the data by reading the data over bus 96. RAM 86 can store instructions for execution by the CPU and data operated on by the CPU.

SD transceiver 84 connects to the clock CLK and parallel data lines DO:3 of SD bus 34 and contains both a clocked receiver and a transmitter. An interrupt to CPU 82 can be generated when a new command is detected on SD bus 34. CPU 82 can then execute a routine to handle the interrupt and process the new command.

SD operating registers 80 include the protocol registers required by the SD specification. Registers may include a data-port, write-protect, flash select, flash status, interrupt, and identifier registers. Other extension registers may also be present.

Command decode and validator 89 detects, decodes, and validates commands received over SD bus 34. Valid commands may alter bus-cycle sequencing by bus state machine 83, and may cause response generator 87 to generate a response, such as an acknowledgement or other reply.

The transmit and receive data from SD engine 81 is stored in FIFO data buffer 94, perhaps before or after passing through a data-port register in SD operating registers 80. Commands and addresses from the SD transactions can also be stored in FIFO data buffer 94, to be read by CPU 82 to determine what operation to perform.

Flash-memory controller 90 includes flash data buffer 98, which may contain the commands, addresses, and data sent over internal flash bus 36 to one or more flash mass storage chips. Data can be arranged in flash data buffer 98 to match the bus width of internal flash bus 36, such as in 32 or 94-bit words. DMA engine 88 can be programmed by CPU 82 to transfer a block of data between flash data buffer 98 and FIFO data buffer 94.

Flash control registers 93 may be used in conjunction with flash data buffer 98, or may be a part of flash memory buffer 98. Flash-specific registers in flash control registers 93 may include a data port register, interrupt, flash command and selection registers, flash-address and block-length registers, and cycle registers.

Error-corrector 92 can read parity or error-correction code (ECC) from flash mass storage chips and perform data corrections. The parity or ECC bits for data in flash data buffer 98 that is being written to flash mass storage chips can be generated by error-corrector 92.

Flash programming engine 97 can be a state machine that is activated on power-up reset. Flash programming engine 97 programs DMA engine 88 within the address of the boot loader code in the first page of the flash mass storage chip, and the first address in RAM 86. Then flash programming engine 97 commands DMA engine 88 to transfer the boot loader from the flash mass storage chip to RAM 86. CPU 82 is then brought out of reset, executing the boot loader program starting from the first address in RAM 86. The boot loader program can contain instructions to move a larger control program from the flash mass storage chip to RAM 86. Thus SD flash microcontroller 100 is booted without an internal ROM on internal bus 96.

ALTERNATE EMODIMENTS

Several other embodiments are contemplated by the inventors. For example, while 1.8 and 3.3 volt power-supply voltages have been described, other voltages could be substituted, such as 1.5, 1.2, 1.85, 3.0, 3.5, etc. volts. Actual measured voltages may vary somewhat, such as +/−10%. Signals may have a high voltage that is somewhat less or greater than the power-supply voltages. For example, a high signal of 3.0 volts is likely to be sufficiently high to be read as a high logic state by an input to a 3.3-volt chip.

The flash power voltage to flash-memory chip 40 does not have to be 3.3 volts, nor does it have to match the higher power voltage on SD bus 34. Flash-memory chip 40 could operate at another voltage, such as 2.5 volts or 4 volts. Some chips may have a second power supply input at a different voltage. While power-supply voltages are referenced to a ground supply, negative supplies or other references could be substituted. Voltages and voltage ranges may be shifted.

Different numbers and arrangements of SD flash storage blocks can connect to the controller. Rather than use SD buses, other buses may be used such as Memory Stick, PCI Express bus, Compact Flash (CF), IDE bus, Serial ATA (SATA) bus, etc. Additional pins can be added or substituted for the SD data pins. A multi-bus-protocol chip could have an additional personality pin to select which bus interface to use, or could have programmable registers. Rather than have a SD microcontroller, a Memory Stick microcontroller could be substituted, for use with a memory-stick interface, etc.

While the invention has been described using an SD controller, a MMC controller may be substituted. A combined controller that can function for both MMC and SD may also be substituted. SD may be considered an extension of MMC, or a particular type of MMC, rather than a separate type of bus.

While the invention has been described as not requiring ROM for booting, some ROM may still be present on the chip. For example, a revision number may be included in a small ROM. Hard-wired gates that are tied to power or ground may also function as a read-only memory. While such ROM may be present, ROM is not required for storing boot code or booting instructions. A few bytes or more of ROM may be thus present for other purposes.

Mode logic could sense the state of a pin only at power-on rather than sense the state of a dedicated pin. A certain combination or sequence of states of pins could be used to initiate a mode change, or an internal register such as a configuration register could set the mode.

The microcontroller and SD components such as the bus interface, DMA, flash-memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

Data and commands may be routed in a variety of ways, such as through data-port registers, FIFO or other buffers, the CPU's registers and buffers, DMA registers and buffers, and flash registers and buffers. Some buffers may be bypassed or eliminated while others are used or present. Virtual or logical buffers rather than physical ones may also be used. Data may be formatted in a wide variety of ways.

The host can transfer standard SD commands and data transactions to the SD transceiver during a transaction. Other transaction types or variations of these types can be defined for special purposes. These transactions may include a flash-controller-request, a flash-controller-reply, a boot-loader-request, a boot-loader-reply, a control-program-request, a control-program-reply, a flash-memory-request, and a flash-memory-reply. The flash-memory request/reply may further include the following request/reply pairs: flash ID, read, write, erase, copy-back, reset, page-write, cache-write and read-status.

The host may be a personal computer (PC), a portable computing device, a digital camera, a phone, a personal digital assistant (PDA), or other electronic device.

Wider or narrower data buses and flash-memory blocks could be substituted, such as 4, 5, 8, 16, 32, 64, 128, 256-bit, or some other width data channels. Alternate bus architectures with nested or segmented buses could be used internal or external to the microcontroller. Two or more internal and flash buses can be used in the SD flash microcontroller to increase throughput. More complex switch fabrics can be substituted for the internal buses.

The flash mass storage blocks can be constructed from any flash technology including NAND, NOR, AND, or multi-level-logic (MLC) memory cells. Data striping could be used with the flash mass storage blocks in a variety of ways, as can parity and error-correction code (ECC). Data re-ordering can be adjusted depending on the data arrangement used to prevent re-ordering for overlapping memory locations. An SD/MMC switch could be integrated with other components or could be a stand-alone chip. The SD/MMC switch could also be integrated with the SD single-chip flash device. While a single-chip device has been described, separate packaged chips or die may be stacked together while sharing I/O pins, or modules may be used.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dual-voltage protocol card comprising:
   a flash-memory chip for storing blocks of data in a non-volatile flash memory;
   an insertable end for inserting into a protocol socket on a host;
   a bus connection formed on the insertable end, for mating with connectors on the protocol socket on the host to connect to a host protocol bus on the host;
   a host power line formed on the insertable end, for connecting to a host power connector on the protocol socket;
   wherein the host power line receives a high power voltage from the host socket when the host is a legacy host;
   wherein the host power line receives a reduced power voltage from the host socket when the host is a reduced-voltage host, wherein the reduced power voltage is less than the high power voltage;
   a voltage regulator on the dual-voltage protocol card, the voltage regulator connected to the host power line, the voltage regulator generating an internal reduced voltage from the high power voltage from the legacy host or from the reduced power voltage from the reduced-voltage host;
   a controller core on the dual-voltage protocol card that receives the internal reduced voltage from the voltage regulator to power internal circuitry;
   a flash controller in the controller core for communicating with the flash-memory chip;
   a protocol controller in the controller core for communicating with the host;
   a voltage converter that receives the internal reduced voltage from the voltage regulator, the voltage converter generating a flash power voltage from the internal reduced voltage; and
   a power-supply input of the flash-memory chip that receives the flash power voltage generated by the voltage converter, wherein the flash power voltage powers the flash-memory chip,
   whereby dual voltages from the legacy host or from the reduced-voltage host are converted to the internal reduced voltage to power the controller core, and to the flash power voltage to power the flash-memory chip.

2. The dual-voltage protocol card of claim 1 further comprising:
   a flash and voltage controller chip that comprises the controller core and the voltage converter.

3. The dual-voltage protocol card of claim 2 wherein the voltage regulator comprises a power management unit integrated into the flash and voltage controller chip.

4. The dual-voltage protocol card of claim 2 wherein the controller core comprises:
   a protocol interface for extracting host commands from host transactions received over the host protocol bus from the host;
   a flash memory manager for translating addresses in the host commands to physical addresses of blocks within the flash-memory chip; and
   a flash module interface for generating erase, write, and read commands of blocks in the flash-memory chip using the physical addresses from the flash memory manager.

5. The dual-voltage protocol card of claim 2 wherein the flash and voltage controller chip further comprises:
   a card interface I/O connected to the host protocol bus by the bus connection, for converting I/O voltages on the host protocol bus to reduced-voltage signals to the controller core.

6. The dual-voltage protocol card of claim 5 further comprising:
   a first power connection to the card interface I/O, the first power connection coupled to the host power line to receive the high power voltage from the host socket when the host is the legacy host, and to receive the reduced power voltage from the host socket when the host is the reduced-voltage host.

7. The dual-voltage protocol card of claim 2 further comprising:

a flash bus connected to the flash-memory chip, for carrying data and physical addresses of blocks being erased, written, or read in the flash-memory chip.

8. The dual-voltage protocol card of claim 7 further comprising:

a flash bus I/O connected to the flash-memory chip through the flash bus, for converting reduced-voltage signals in the controller core to I/O voltages on the flash bus.

9. The dual-voltage protocol card of claim 8 further comprising:

a second power connection to the flash bus I/O, the second power connection coupled to receive the flash power voltage from the voltage converter.

10. The dual-voltage protocol card of claim 9 wherein the flash power voltage is higher than the internal reduced voltage, wherein the voltage converter increases the internal reduced voltage to generate the flash power voltage.

11. The dual-voltage protocol card of claim 10 wherein the voltage converter comprises a charge pump to increase voltage.

12. The dual-voltage protocol card of claim 1 wherein the high power voltage is at least 3 volts and wherein the reduced power voltage is less than 2 volts.

13. The dual-voltage protocol card of claim 12 wherein the internal reduced voltage is less than 2 volts and wherein the flash power voltage is greater than 3 volts.

14. The dual-voltage protocol card of claim 1 wherein the host protocol bus is a secure digital (SD) protocol bus having a single power line that is driven to 3.3 volts by legacy hosts and is driven to 1.8 volts by reduced-voltage hosts.

15. The dual-voltage protocol card of claim 1 wherein the host protocol bus is a secure digital (SD) protocol bus, a Multi-Media Card (MMC) protocol bus, a Compact Flash (CF) protocol bus, a Memory-Stick protocol bus, a PCI Express protocol bus, an IDE protocol bus, or a Serial ATA (SATA) protocol bus.

16. A flash-and-voltage-controller chip comprising:

a voltage regulator that generates an internal power voltage, the voltage regulator being connected to a power line to a host, the power line being driven to a high power voltage by a legacy host, the power line being driven to a reduced power voltage by a reduced-voltage host;

wherein the reduced power voltage is at least 1 volt less than the high power voltage;

a voltage converter receiving the internal power voltage from the voltage regulator, the voltage converter generating a flash power voltage that is above the internal power voltage;

a flash power output for connecting the flash power voltage generated by the voltage converter to power a flash-memory chip;

a flash bus for connecting to the flash-memory chip, the flash bus carrying address, data, and commands to the flash-memory chip;

a controller core that is powered by the internal power voltage, the controller core comprising:

a clocked-data interface to a host bus that connects to a host;

a bus transceiver for detecting and processing commands sent over the host bus;

a buffer for storing data sent over the host bus;

an internal bus coupled to the buffer;

a random-access memory (RAM) for storing instructions for execution, the RAM on the internal bus;

a central processing unit (CPU), on the internal bus, the CPU accessing and executing instructions in the RAM;

a flash-memory controller, on the internal bus, for generating flash-control signals and for buffering commands, addresses, and data to the flash bus; and a direct-memory access (DMA) engine, on the internal bus, for transferring data over the internal bus.

17. The flash-and-voltage-controller chip of claim 16 wherein data in the flash-memory chip are accessible by the flash-memory controller sending a request sequence over the flash bus, the request sequence including a command followed by a physical address;

wherein the data in the flash-memory chip is block-addressable while the RAM is randomly-addressable by the CPU.

18. The flash-and-voltage-controller chip of claim 16 wherein the high power voltage is above 3 volts and the reduced power voltage and the internal power voltage are both below 2 volts.

19. A dual-supply-voltage flash drive comprising:

a flash-memory means for storing blocks of data in a non-volatile memory that retains data when power is lost;

a Secure Digital (SD) interface that connects to a host over a SD host bus;

a power signal in the SD interface, the power signal driven to a first power voltage by a first host, the power signal driven to a second power voltage by a second host, wherein the first power voltage and the second power voltage differ by at least one volt;

voltage regulator means, receiving the power signal from the SD interface, for generating an internal power voltage that is lower than the first power voltage;

voltage converter means, receiving the internal power voltage from the voltage regulator means, for generating a flash power voltage;

flash powering means for driving a power-supply input to the flash-memory means with the flash power voltage generated by the voltage converter means;

protocol interface means for extracting host commands from host transactions received over the SD host bus from the host;

flash memory manager means for translating addresses in the host commands to physical addresses of blocks within the flash-memory means;

flash interface means for generating erase, write, and read commands of blocks in the flash-memory means using the physical addresses from the flash memory manager means; and internal power means, receiving the internal power voltage from the voltage regulator means, for powering the protocol interface means, the flash memory manager means, and the flash interface means with the internal power voltage.

20. The dual-supply-voltage flash drive of claim 19 wherein the protocol interface means comprises:

a SD transceiver for receiving clocked data and commands from the host bus, and for driving data onto the host bus in response to a command;

SD operating registers for storing data and commands in a format specified by a Secure Digital (SD) specification; and a command decoder and validator, coupled to the SD operating registers, for decoding and validating a command received over the host bus by the SD transceiver.

* * * * *